(12) United States Patent  
Noguchi et al.

(10) Patent No.: US 9,300,289 B2  
(45) Date of Patent: Mar. 29, 2016

(54) SWITCH DEVICE

(71) Applicant: TOYO DENSO KABUSHIKI KAISHA, Tokyo (JP)

(72) Inventors: Yoshitaka Noguchi, Tsurugashima (JP); Hideaki Itoh, Tsurugashima (JP); Kiyoshi Watanabe, Tokyo (JP)

(73) Assignee: TOYO DENSO KABUSHIKI KAISHA, Tokyo (JP)

( * ) Notice: Subject to any disclaimer, the term of this patent is extended or adjusted under 35 U.S.C. 154(b) by 226 days.

(21) Appl. No.: 13/928,707

(22) Filed: Jun. 27, 2013

(65) Prior Publication Data

US 2014/0002177 A1  Jan. 2, 2014

(30) Foreign Application Priority Data

Jun. 29, 2012 (JP) ................................. 2012-146573

(51) Int. Cl.  
*H03K 17/975* (2006.01)  
*H03K 17/96* (2006.01)

(52) U.S. Cl.  
CPC .. *H03K 17/9622* (2013.01); *H03K 2217/94094* (2013.01); *H03K 2217/960755* (2013.01)

(58) Field of Classification Search  
CPC ............... H03K 17/9622; H03K 2217/94094; H03K 2217/960755

USPC ........................................................ 200/600  
See application file for complete search history.

(56) References Cited

U.S. PATENT DOCUMENTS

2012/0247938 A1* 10/2012 Saito et al. .................... 200/600

FOREIGN PATENT DOCUMENTS

JP  2008-141329 A  6/2008  
JP  2009-111996 A  5/2009

* cited by examiner

*Primary Examiner* — Renee Luebke  
*Assistant Examiner* — Lheiren Mae A Caroc  
(74) *Attorney, Agent, or Firm* — Bruzga & Associates; Charles E. Bruzga; Jay S. Pattumudi

(57) ABSTRACT

A switch device includes: a first touch sensor portion to which one end of a first wiring portion is connected; a second touch sensor portion to which one end of a second wiring portion is connected; and a touch wiring portion having one end of which is connected only to the second wiring portion and the other end of which is open; the touch wiring portion being arranged such that when one capacitance is produced between the touch surface and the first wiring portion by a touch operation, the other capacitance is produced between the touch surface and the touch wiring portion by the touch operation; and the touch operation is disabled when detecting the one capacitance and the other capacitance. A finger touches a portion other than a touch sensor portion (wiring portion), and the touch is disabled, and thereby, a high reliability is achieved.

4 Claims, 6 Drawing Sheets

SWITCH DEVICE

FIELD OF THE INVENTION

The present invention relates to a switch device that includes a switch operation unit having a touch surface and employs a capacitive method for inputting.

BACKGROUND OF THE INVENTION

JP 2008-141329 A (see paragraphs 0008-0010 and FIG. 8) discloses a switch device that has a plurality of switch electrodes and a surrounding switch electrode for surrounding the periphery of the switch electrodes. The surrounding switch electrode is equipped with openings that are similar to and slightly larger than each of the switch electrodes, each of the switch electrodes being disposed in each of the openings. The switch device thus configured is set to be turned "on" if a value detected when a finger touches each switch electrode satisfies a predetermined threshold. The surrounding switch electrode is turned on if a dielectric such as water gets in touch therewith. The switch device is configured such that the switch device determines that the switch electrode is operated by the finger if a change in the capacitance of the switch electrode satisfies the threshold and a change in the capacitance of the surrounding switch electrode is not observed, and such that the switch device determines that water or the like is attached to the surrounding switch electrode if changes in the capacitance of both of the switch electrode and the surrounding switch electrode are observed.

A switch device disclosed in JP 2009-111996 A (see paragraphs 0021-0023 and FIG. 1) has a dummy switch as well as a first and second contact switch adjacent to each other. The dummy switch, which is formed in a rectangular and annular shape with missing parts, is provided so as to separately surround the first and second contact switches. Here, assuming both of the contact switches are operated simultaneously if the dummy switch also provides an output simultaneously when the first contact switch provides an output, it is configured to disable the output of the first contact switch. The second contact switch is also operated in the same manner as described above.

The above-described switch device is configured of a transparent electrode material, for example such as ITO (Indium Tin Oxide), and conductive paste such as silver paste is often used to form a wiring pattern thereof. The switch thus configured, which is applied to, for example, an in-vehicle touch panel to be operated, is generally disposed in a place easily viewed.

There remains a continuous need for improved switch devices.

SUMMARY OF THE INVENTION

As described above, a switch electrode, a contact switch and the like are disposed in a place easily viewed; however, not only the above switch and the like but also a wiring pattern associated therewith are easily viewed. Although it is natural for the switch and the like to be noticeable, the wiring pattern should stand out as little as possible to keep the design of, for example, a touch panel on which they are disposed. The thickness of the wiring pattern should be as thin as possible in order not to stand out. However, since thinning reduces the cross-sectional area of the wiring pattern, an increase of wiring resistance is prone to electrical problems accordingly. In order to suppress an increase in wiring resistance, widening the width of the wiring pattern can be considered, for example. Widening the width, however, causes capacitance to increase according to the widened width, and as a result, the wiring pattern having sufficient capacitance may perform the same function as the switch. That is, a touch on the wiring pattern is treated electrically equivalent to a touch on the switch, and an inconvenience that this leads to the malfunction of an entire switch occurs.

The above-mentioned inconvenience will not be a problem if an operator touches only a switch with his finger and does not touch the other portions. However, the operator often touches by mistake a portion other than a switch that he intended to touch, and that is inevitable. Everyone will experience, for example, that he presses a radio switch with his finger despite his aim of operating a car navigation, or he turns off an air conditioner that has been turned on by accidentally touching a wiring portion with his moving finger despite no intention of pressing. Such experiences, however, is not pleasant, and that leads to the distrust of the switch device. The present invention has been made from this viewpoint. That is, an object of the present invention is to provide a highly reliable switch device that does not malfunction even if a finger touches a portion other than a switch (touch sensor portion).

To solve the problem above, the present invention is configured as follows. Definitions of terms provided in the explanation of the invention described in any of claims are applied, regardless of their order, to the inventions of the other claims to the extent possible.

(Features of the First Aspect of the Present Invention)

A switch device according to a first aspect of the invention (hereinafter, referred to as a device of the first aspect) is a switch device including: a first touch sensor portion to which one end of a first wiring portion is connected; a second touch sensor portion to which one end of a second wiring portion is connected; the first and second touch sensor portions being disposed on the back surface side of a dielectric sheet having the front surface side as a touch surface, a sensor control unit to which another end of the first wiring portion and another end of the second wiring portion are electrically connected. Here, in the a touch wiring portion, one end of which is connected only to the second wiring portion and another end of which is open is arranged on the back surface side of the dielectric sheet such that when one capacitance is produced between the touch surface and the first wiring portion by a touch operation on the touch surface, the other capacitance is produced between the touch surface and the touch wiring portion by the touch operation. In addition, the sensor control unit is configured to disable the touch operation when detecting the one capacitance and another capacitance.

When a touch operation (typically a wrong operation) on a touch surface is performed, the device of the first aspect forms a capacitor structure with a conductor such as a finger or a part of the body other than the finger and the first wiring portion facing each other across a dielectric sheet therebetween, thereby producing one capacitance. The touch operation also produces the other capacitance between the conductor and the touch wiring portion. The one capacitance and the other capacitance are detected by the sensor control unit through the first and second wiring portions, respectively, and as a result thereof the sensor control unit disables the touch operation. Here, without the touch wiring portion, the touch operation on the first wiring portion (i.e., generation of the one capacitance) may be mistaken for the touch operation on the first touch sensor portion (i.e., generation of the capacitance), while the mistake can be eliminated because the touch operation is disabled by the touch wiring portion. Thus, a switch device with less malfunction and a high reliability can be provided. While the touch wiring portion can be arranged over the entire length of the first wiring portion, it does not necessarily have to be arranged over the entire length. When considering the first and second touch sensor portions, and, in addition thereto, shapes, lengths, relative positions and the like of the first and second wiring portions, the touch wiring portion may be provided only in a portion where a wrong (unnecessary) touch may be made. The terms "first" and "second" described in the specification are not intended to distinguish either of them, while this indicates the other when any of them is assumed to be one. Accordingly, no master-subordinate relationship and no dependency exist between both, and the replacement of both affects nothing.

(Features of the Second Aspect of the Present Invention)

A switch device according to a second aspect of the invention (hereinafter, referred to as a device of the second aspect) is the switch device according to the first aspect, wherein the touch wiring portion is arranged substantially parallel to the first wiring portion, and the other end of the touch wiring portion is disposed in the vicinity of the first touch sensor portion. If the first wiring portion has a bent portion, or a curved portion or the like, it is preferable that the touch wiring portion is also configured to have such a bent portion, or a curved portion or the like. Thus, the touch wiring portion is preferably configured to be adjacent to the first wiring portion and also to be along therewith.

According to the device of the second aspect, in addition to the effects of the device of the first aspect, the other end, i.e., open end, of the touch wiring portion is disposed in the vicinity of the first touch sensor portion, and thus, the most of the first wiring portion is accompanied by the touch wiring portion. A wrong touch operation is therefore disabled at most of the first wiring portion, and this can achieve higher reliability.

(Features of the Third Aspect of the Present Invention)

A switch device according to a third aspect of the invention (hereinafter, referred to as a device of the third aspect) is the switch device according to the first or second aspect and further includes n (n is a natural number) pieces of touch sensor portions other than the first and second touch sensor portions, and n pieces of wiring portions corresponding to the n pieces of the touch sensor portions, wherein the same structural and electrical relationship as that between the first and second wiring portions is formed between wiring portions adjacent to each other in the n pieces of the wiring portions. Assuming n=1, if regarding the second wiring portion as one wiring portion and the third wiring portion as the other wiring portion, for example, the same structural and electrical relationship as that between the first wiring portion and the second wiring portion can be formed between the both wiring portions.

In addition to the effects of the device of the first or second aspect, the device of the third aspect disables a wrong touch operation on the wiring portion even if multiple sensor portions (wiring portions) are provided, and thus can improve the reliability of the entire switch device.

The invention can provide a highly reliable switch device that does not malfunction even if a finger touches a portion (wiring portion) other than a touch sensor portion.

BRIEF DESCRIPTION OF DRAWINGS

Further features and advantages of the invention will become apparent from reading the following detailed description in conjunction with the following drawings, in which like reference numbers refer to like parts.

DETAILED DESCRIPTION

The examples and drawings provided in the detailed description are merely examples, and should not be used to limit the scope of the claims in any claim construction or interpretation.

(Overall Configuration of Switch Device)

Figure 1:
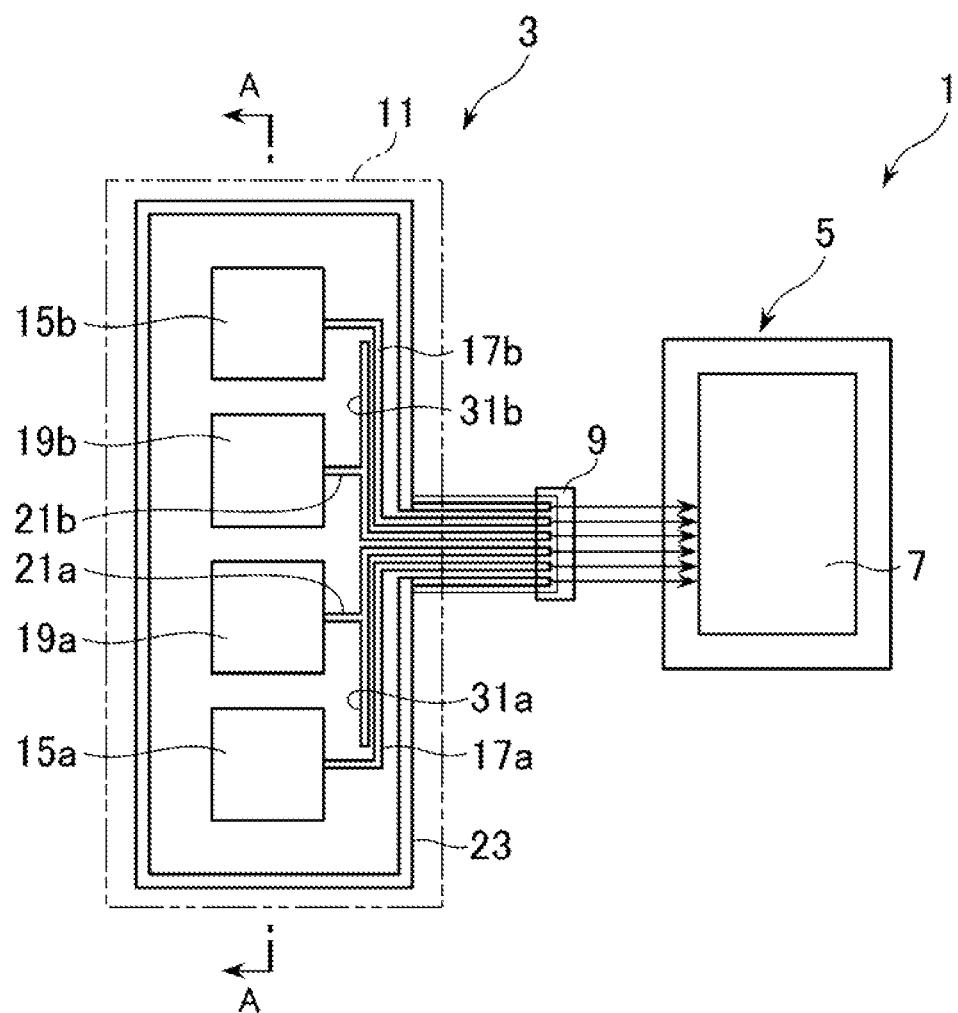
FIG. 1 is an overall schematic view of a switch device.
Figure 2:
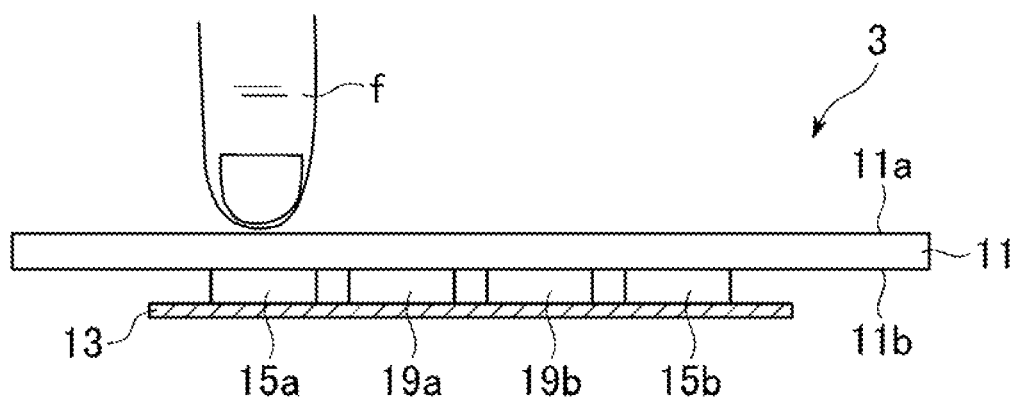
FIG. 2 is an A-A cross-sectional view of a panel switch shown in FIG. 1.

As shown in FIGS. 1 and 2, a switch device 1 includes a panel switch 3 and a control board 5. The surface of the panel switch 3 is covered with a dielectric sheet 11 having a rectangular shape in a plan view. The dielectric sheet 11 includes a dielectric material such as acrylic plate or glass plate, and its front surface side (top surface shown in FIG. 2) is a touch surface 11a that an operator touches with his finger f (FIG. 2) or the like. A rectangular electrode sheet 13 constituting of, for example, a Polyethylene Terephthalate (PET) film is adhered to a back surface 11b side of the dielectric sheet 11 with an adhesive (e.g., double-sided tape, not shown).

The electrode sheet 13 includes: a first touch sensor portion 15a (15b); a first wiring portion 17a (17b) having one end connected to the first touch sensor portion 15a (15b); a second touch sensor portion 19a (19b) adjacent to the first touch sensor portion 15a (15b); a second wiring portion 21a (21b) having one end connected to the second touch sensor portion 19a (19b); and a GND wiring portion 23 arranged so as to surround the periphery of the electrode sheet 13, the above portions being formed of transparent electrodes such as Indium Tin Oxide (ITO). Reference numeral 31a (31b) indicates a touch wiring portion 31a (31b). In the present embodiment, the electrode sheet 13 is disposed on the back surface 11b side of the dielectric sheet 11. Alternatively, without disposing the electrode sheet 13, the touch sensor portion, the wiring portion, and the touch wiring portion may be disposed on the back surface 11b side of the dielectric sheet 11.

As shown in FIG. 1, the control board 5 is equipped with a single-chip microcomputer 7. Terminals of the single-chip microcomputer 7 are electrically connected to the wiring portions of the electrode sheet 13 through a connector 9. The touch wiring portion 31a (31b) is described in another paragraph. The following pairs of components having the same structures, respectively, are only symmetrically arranged, and only each of the former references is described, without description of each of the letters: the first touch sensor portions 15a and 15b; the first wiring portions 17a and 17b; the second touch sensor portions 19a and 19b; the second wiring portions 21a and 21b; and the touch wiring portions 31a and 31b.

(Structure of Touch Wiring Portion)

Figure 3:
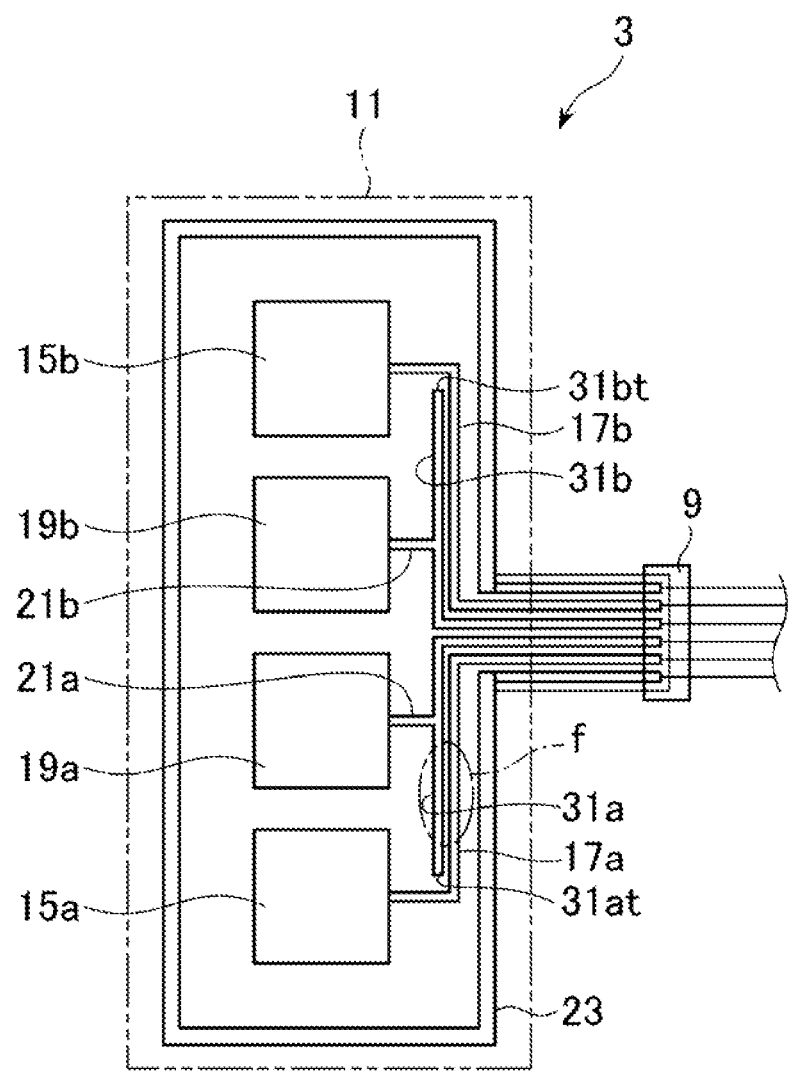
FIG. 3 is an enlarged view of the panel switch shown in FIG. 1.

As shown in FIG. 3, the touch wiring portion 31a has one end and the other end. The one end is connected only to the second wiring portions 21a, which is connected to no other electrodes, and the other end is an open end 31at, where description of an open end 31bt is omitted. More specifically, the touch wiring portion 31a, which branches from the bent portion of the second wiring portion 21a, is arranged so as to project in parallel to the first wiring portion 17a. The open end 31at of the touch wiring portion 31a is positioned in the vicinity of the bent portion of the first wiring portion 17a. In the present embodiment, wire diameters (widths) of the first wiring portion 17a, the second wiring portions 21a, and the touch wiring portion 31a are set to about 1 mm, and a gap width between the first wiring portion 17a and the touch wiring portion 31a is set to a range of 0.02 to 0.2 mm. The wire diameters of the first wiring portion 17a etc. are not limited to about 1 mm given above. Alternatively, each of the widths may be suitably adjusted according to, for example, the degree of wiring integration as well as the size and number of the panel switch 3. On the other hand, a gap width between the first wiring portion 17a and the touch wiring portion 31a is preferably set to 0.2 mm or less. Although the setting range can be exceeded in some cases, a gap width of 0.2 mm or less is preferred for the following reason. In view of the shape and size of a finger of a person, the gap width given above is a width where when the first wiring portion 17a is touched with a finger f (FIG. 2, and shown by a two-dot chain line in FIG. 3), the touch wiring portion 31a is also forced to be touched, i.e., a width due to which it is difficult to touch only the first wiring portion 17a with a finger.

When the finger f (conductor) approaches the touch surface 11a of the panel switch 3 having the above structure, a capacitor structure that sandwiches the dielectric sheet 11 between an electrode (e.g., the second touch sensor portion 19a) and the finger f is formed to increase the capacitance between the two. In contrast, when the finger moves away from the panel switch 3, the capacitor structure collapses to decrease the capacitance. This relationship is the same as that in the portions other than the second touch sensor portion 19a, including the touch wiring portion 31a. Thus, when the first wiring portion 17a is touched from the touch surface 11a (by the finger), a touch on the touch wiring portion 31a is, as a result, made associated with this. At this moment, the capacitance between the finger and the first wiring portion 17a and between the finger and the touch wiring portion 31a increases, respectively.

The microcomputer 7 shown in FIG. 1 is configured to execute software stored in a built-in Read Only Memory (ROM) in a given work area. The microcomputer 7 is basically operated as follows: The microcomputer 7 turns on a switch when it compares an increment of the capacitance based on a touch on the first touch sensor portion 15a or the second touch sensor portion 19a with a threshold (sensor threshold) stored in the memory to be satisfied, while it turns off the switch when an increase in the capacitance based on the next touch satisfies the sensor threshold. Although a single-chip microcomputer is employed here due to its compactness, ease of wiring work and the like, there is no difficulty in configuring the control board 5 using a member other than the single-chip microcomputer.

In the present embodiment, the above sensor threshold is set to turn on and off the switch with the increment of the capacitance based on a touch on the first wiring portions 17a and the touch wiring portion 31a. It is self-evident that the footprint of the first wiring portions 17a and the touch wiring portion 31a is smaller than that of the first touch sensor portion 15a and the second touch sensor portion 19a, and this means that the former two have a smaller increment of the capacitance than the latter two. Thus, the fact that setting the sensor threshold so as to respond the former two can also respond to the latter two is why the sensor threshold is set to respond to the first wiring portions 17a and the touch wiring portion 31a.

Here, if, when the microcomputer 7 detects that (an increase in) the capacitance of the first touch sensor portion 15a satisfies the sensor threshold based on a touch operation on the touch surface 11a, the microcomputer 7 also detects that (an increase in) the capacitance of the second touch sensor portion 19a satisfies the sensor threshold based on the same touch operation as described above, the microcomputer 7 is programmed to disable the touch operation on the first touch sensor portion 15a. This means that if, when the microcomputer 7 detects that (an increase in) the capacitance of the first wiring portion 17a satisfies the sensor threshold based on a touch operation on the touch surface 11a, the microcomputer 7 also detects that (an increase in) the capacitance of the touch wiring portions 31a satisfies the sensor threshold based on the same touch operation as described above, the microcomputer 7 is also programmed to disable the touch operation on the first touch sensor portion 15a. As described above, the present embodiment does not distinguish between a touch on the first touch sensor portion 15a etc. and a touch on the touch wiring portions 31a etc. (i.e., a touch on the latter is regarded as a touch on the former), whereas programming to distinguish the latter from the former may be allowed.

(Example of Detection Operation)

Figure 4:
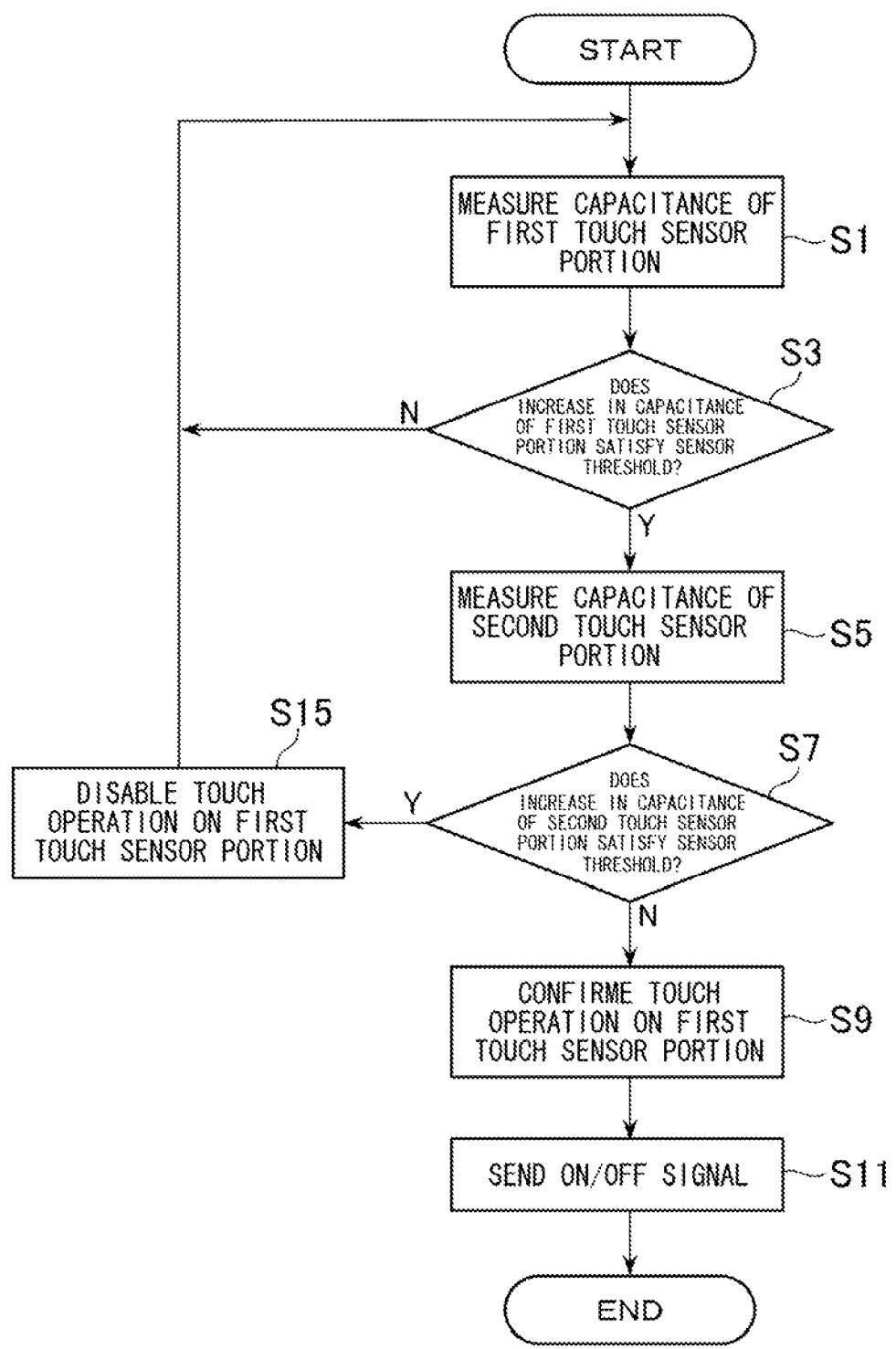
FIG. 4 is a flow chart showing a detection operation.

The operation of the switch device 1 will now be described with reference to FIGS. 1, 2, and 4. In one example, the microcomputer 7 always measures an increase in the capacitance of the first touch sensor portion 15a based on a touch of an operator (S1), and determines if an increment of the capacitance satisfies the sensor threshold at the time of measurement (S3). In S3, if the sensor threshold is not satisfied, the microcomputer 7 returns to S1 to measure an increase in the capacitance of the first touch sensor portion 15a again. On the other hand, the microcomputer 7, in which an increase in the capacitance satisfies the sensor threshold in S3, measures the capacitance of the second touch sensor portion 19a (S5). This measurement is to confirm whether a touch on the second touch sensor portion 19a as well as a touch on the first touch sensor portion 15a is made (i.e., the second touch sensor portion 19a is erroneously operated).

If the microcomputer 7 detects an increase in the capacitance of the second touch sensor portion 19a in S5, the microcomputer 7 determines whether the increase in the capacitance satisfies the sensor threshold (S7). If the microcomputer 7 determines that the increase in the capacitance of the second touch sensor portion 19a does not satisfy the sensor threshold in S7, the microcomputer 7 confirms a touch operation on the first touch sensor portion 15a to be valid (S9) to send an "on" or "off" signal (S11). Transmission of the "on" or "off" signal is a basic function of the switch device 1.

On the other hand, the microcomputer 7, which has determined that the capacitance of the second touch sensor portion 19a satisfies the sensor threshold in S7, disables the touch operation on the first touch sensor portion 15a due to a wrong operation (S15). Here, although not employed in the present embodiment, it may be configured, for example, to emit an alarm sound to inform the operator of being disabled or to blink the first touch sensor portion 15a as well as to disable the operation in S15.

When a touch on the first wiring portion 17a is made (by the finger f shown by the two-dot chain line in FIG. 3) through the touch surface 11a, the microcomputer 7 does not distinguish between a touch on the first wiring portion 17a and a touch on the first touch sensor portion 15a. Accordingly, the microcomputer 7 regards the touch on the first wiring portion 17a as the touch on the first touch sensor portion 15a to perform processing (S1 and S3). If the touch on the first wiring portion 17a satisfies the sensor threshold, the microcomputer 7 measures the capacitance of the second touch sensor portion 19a (S5). At this time, the microcomputer 7 regards the increase in the capacitance based on a touch on the touch wiring portion 31*a* as a touch on the second touch sensor portion 19*a* to disable the touch on the first wiring portion 17*a* (S15). Thus, the touch operation on the first wiring portion 17*a* is disabled, and as a result, the reliability of the switch device 1 can be improved.

(First Modification of Present Embodiment)

Figure 5:
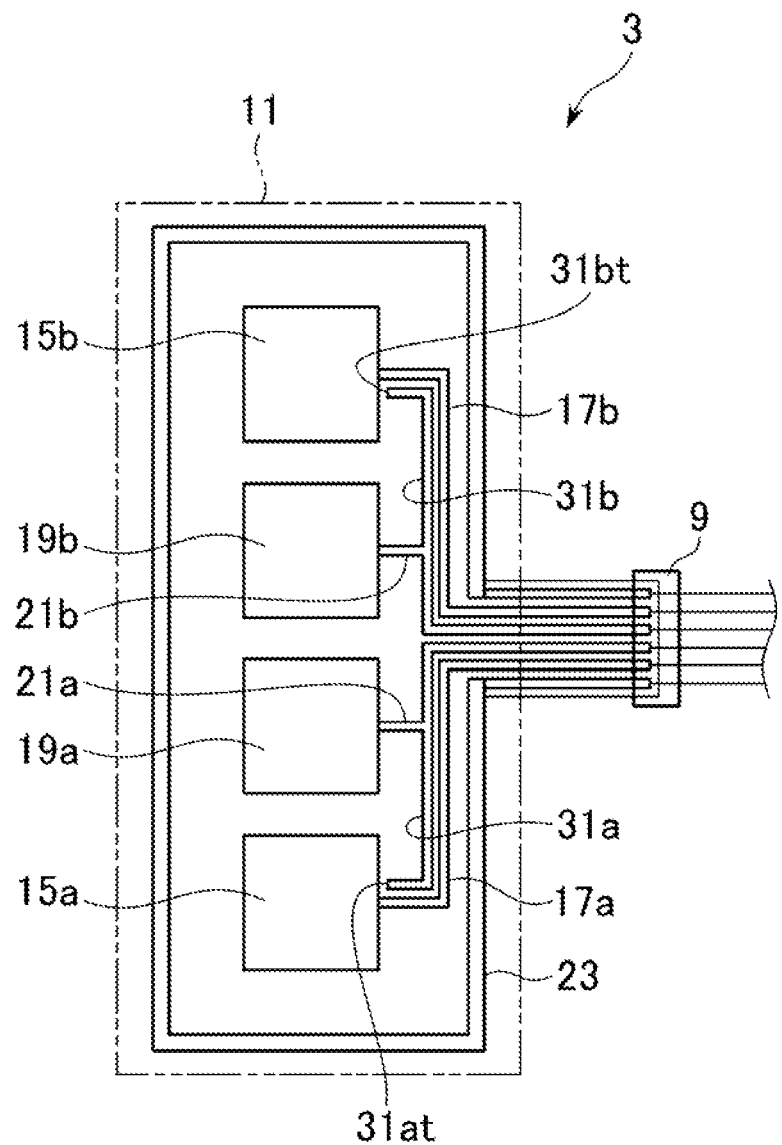
FIG. 5 is a modified diagram of the panel switch shown in FIG. 3.

A panel switch shown in FIG. 5 is not fundamentally different from the panel switch 3 shown in FIG. 3. Both are different only in the shape of touch wiring portions 31*a*. In FIG. 5, accordingly, the same reference numerals are used as those used in FIG. 3, and only the touch wiring portion 31*a* is described.

The touch wiring portion 31*a* shown in FIG. 5 is arranged parallel to the first wiring portion 17*a* as with the first wiring portion 17*a* shown in FIG. 3. The first wiring portion 17*a* has a bent portion bending approximately at a right angle, and the touch wiring portion 31*a* has a similar bent portion, wherein a first modification is characterized in that the other end (open end 31*at*) of the touch wiring portion, where one end of which is connected only to the second wiring portion 19*a* and is disposed in the vicinity of the first touch sensor portion 15*a*. The open end 31*at* is disposed in the vicinity of the first touch sensor portion 15*a*, and thus the most part of the first wiring portion 17*a* is accompanied by the touch wiring portion 19*a*. The first wiring portion 17*a* is therefore not isolated from the touch wiring portion 31*a* at the most part of the portion. As a result, most or all of touch operations on the touch wiring portion 31*a* are disabled. This will contribute to increasing the reliability of the switch device 1 to prevent wrong operations, depending on the use of the switch device and the number and shape etc. of the touch sensor portions.

(Second Modification of Present Embodiment)

Figure 6:
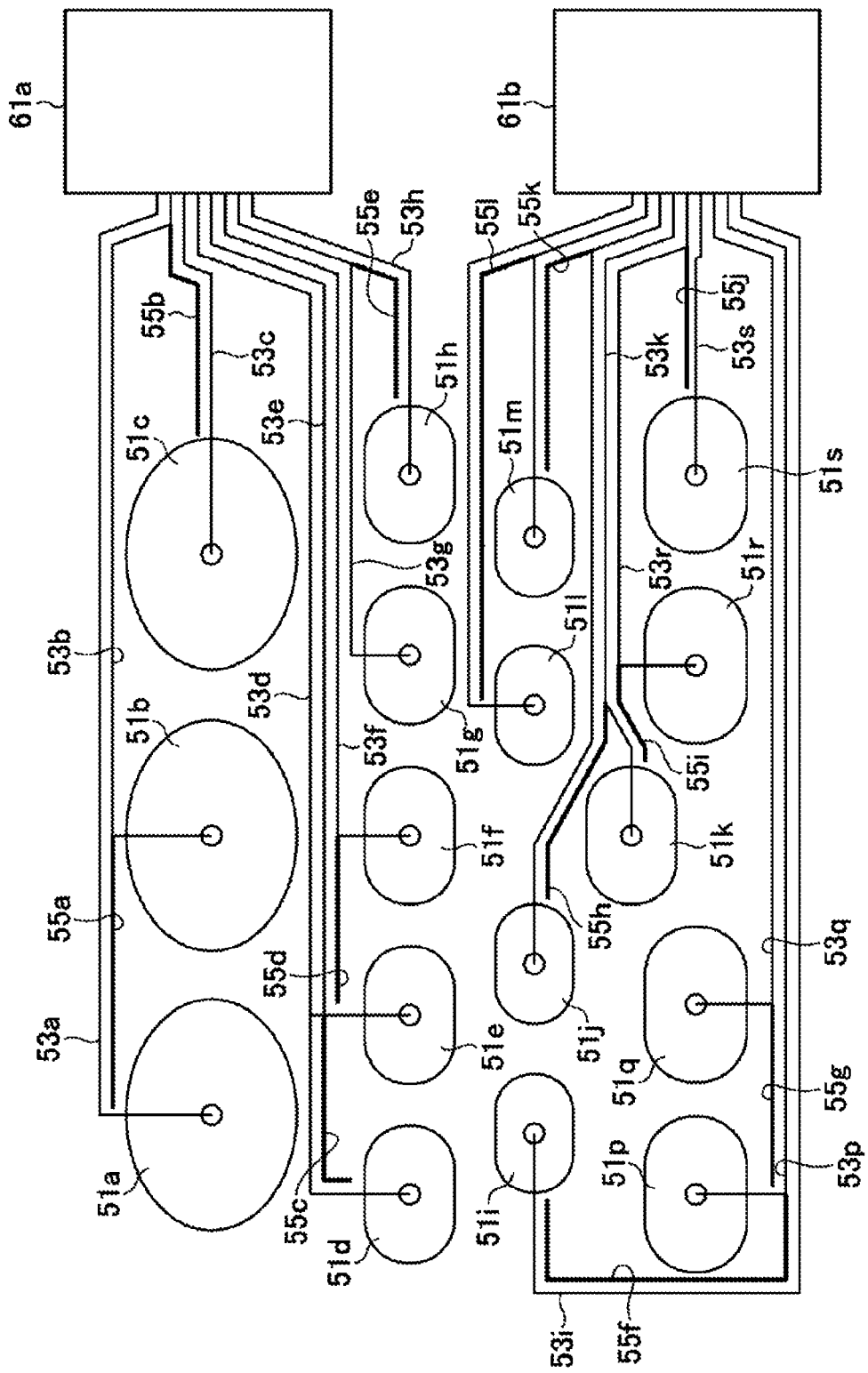
FIG. 6 is a schematic plan view of a panel switch having multiple touch sensor portions.

In FIG. 6, reference numeral 51*a* denotes a first touch sensor portion. Reference numeral 51*b* also denotes a second touch sensor portion adjacent to the first touch sensor portion 51*a*. A touch wiring portion 55*a*, which branches from a bent portion of a second wiring portion 53*b*, is arranged in parallel to a first wiring portion 53*a* connected to the first touch sensor portion 51*a*. Each of reference numerals 61*a* and 61*b* denotes a single-chip microcomputer having the same function as the above-described microcomputer 7.

Other than the first and second touch sensor portions 51*a* and 51*b*, provided in FIG. 6 are 15 (17 in total) touch sensor portions 51*c* to 51*s* (incorrectly alphabetized) and touch wiring portions 55*a* to 55*l* (incorrectly alphabetized) corresponding thereto. Thus, the same structural and electrical relationship as that between the first and second wiring portions 53*a*, 53*b* and the touch wiring portion 55*a* is formed between wiring portions adjacent to each other in other touch sensor portions starting from the touch sensor portion 51*c*. That is, the touch wiring portions are preferably provided so as to double-wire the wiring portions. When a finger touches a wiring portion, double-wiring increases the possibility of also inevitably touching another wiring portion (i.e., the possibility of disabling the touch), and thereby further improves the reliability of an entire switch device.

Also in FIG. 6, a touch wiring portion (for example, touch wiring portion 55*c*) is further arranged for double-wired portions (for example, wiring portions 53*d* and 53*e*). Thus, in order to prevent single wiring (i.e., a single state with no adjacent wiring portion) in a part of a wiring portion extending to an adjacent touch sensor portion (i.e., a part between touch sensor portions 51*e* and 51*d* of the wiring portion 53*d* in the above example), a touch wiring portion that extends to the vicinity of the adjacent touch sensor portion (the touch sensor portion 51*d* in the above example) is provided. That is, the wiring portions 53*d* and 53*e* in the above example are double-wired from a microcomputer 61*a* at the right end of FIG. 6 to a touch sensor 51*e*, while a part past the touch sensor 51*e* is single-wired. Configuration with no single-wiring can provide a highly reliable touch panel with no malfunction. In FIG. 6, the touch wiring portions are indicated thicker than the other wiring portions. This is only to distinguish the both, and the touch wiring portions must not necessarily be thick.

As described above, the number of touch sensor portions other than the first and second touch sensor portions 51*a* and 51*b* in the second modification is 15. The number of the touch sensor portions, however, need not be limited to that, and the number may be allowed to be n (n is a natural number) according to the characteristics such as form, application and function of the switch device.

The term "parallel" includes a concept of being 'substantially parallel.' Substantially parallel includes experimental deviations as known to a person of ordinary skill in the art. For example, an object may not be arranged exactly parallel but includes minor deviations from an exactly parallel orientation.

While the invention has been described with respect to specific embodiments by way of illustration, many modifications and changes will occur to those skilled in the art. It is, therefore, to be understood that the appended claims are intended to cover all such modifications and changes as fall within the true scope and spirit of the invention.

What is claimed is:

1. A switch device comprising:
    a) a first touch sensor portion to which one end of a first wiring portion is connected;
    b) a second touch sensor portion to which one end of a second wiring portion is connected;
    c) the first and second touch sensor portions being disposed on the back surface side of a dielectric sheet having the front surface side as a touch surface;
    d) a sensor control unit to which another end of the first wiring portion and another end of the second wiring portion are electrically connected; and
    e) a touch wiring portion having one end which is connected only to the second wiring portion and having another end being open, and
    f) the touch wiring portion being arranged on the back surface side of the dielectric sheet and being positioned next to the first wiring portion and having a gap width between the first wiring portion and the touch wiring portion such that, when the first wiring portion is touched with a finger, the touch wiring portion is also touched, and when one capacitance is produced between a finger and the first wiring portion by a touch operation using the finger on the touch surface, the touch wiring portion is associated with the touch operation so that another capacitance is produced between the finger and the touch wiring portion by the touch operation, wherein the sensor control unit is configured to disable the touch operation when detecting the one capacitance and the another capacitance.

2. The switch device according to claim 1, wherein
    the touch wiring portion is arranged substantially parallel to the first wiring portion, and
    the other end of the touch wiring portion is disposed in the vicinity of the first touch sensor portion.

3. The switch device according to claim 1, further comprising
    n pieces of touch sensor portions other than the first and second touch sensor portions, and
    n pieces of wiring portions corresponding to the n pieces of the touch sensor portions, wherein the same structural and electrical relationship as that between the first and second wiring portions is formed between wiring portions adjacent to each other in the n pieces of the wiring portions, wherein n is a natural number.

4. The switch device according to claim 1, wherein the sensor control unit is configured to disable the touch operation when the sensor control unit detects an increase in the one capacitance and also an increase in the another capacitance.

* * * * *